(12) United States Patent
Stringer et al.

(10) Patent No.: US 6,380,742 B1
(45) Date of Patent: Apr. 30, 2002

(54) BALANCED MODE OPERATION OF A HIGH FREQUENCY NMR PROBE

(75) Inventors: John Stringer, Longmont; Charles E. Bronnimann, Fort Collins, both of CO (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/916,964

(22) Filed: Jul. 27, 2001

(51) Int. Cl.⁷ .................................................. G01V 3/00
(52) U.S. Cl. ........................ 324/322; 324/318; 324/307
(58) Field of Search ................................. 324/322, 318, 324/316, 311, 307, 319; 343/787

(56) References Cited

U.S. PATENT DOCUMENTS

| | | | |
|---|---|---|---|
| 4,725,780 A | 2/1988 | Yoda et al. ................. | 324/322 |
| 4,859,950 A | 8/1989 | Keren ......................... | 324/322 |
| 4,922,204 A * | 5/1990 | Duerr et al. ................. | 324/322 |
| 5,229,724 A * | 7/1993 | Zeiger ........................ | 324/322 |
| 6,084,410 A * | 7/2000 | Nistler ....................... | 324/318 |
| 6,107,974 A * | 8/2000 | Votruba et al. ............. | 343/787 |

* cited by examiner

Primary Examiner—Edward Lefkowitz
Assistant Examiner—Brij B. Shrivastav
(74) Attorney, Agent, or Firm—Edward H. Berkowitz

(57) ABSTRACT

An NMR probe, lacking electrical balance in respect of the RF coil thereof, includes a conducting shield of axial extent greater than $\lambda/4$ from the ground plane closure of said shield of the probe ($\lambda$ being the highest resonant frequency of interest), the components of the probe other than the coil being confined to the axial region less than $\lambda/4$ from the ground plane and spaced apart from the shield.

6 Claims, 6 Drawing Sheets

BALANCED MODE OPERATION OF A HIGH FREQUENCY NMR PROBE

FIELD OF THE INVENTION

The invention is in the field of magnetic resonance, in general, and specifically pertains to improved balanced circuit performance for magnetic resonance probes.

BACKGROUND OF THE INVENTION

Coupling an RF source through a transmission line to a load traditionally involves a careful matching of the load impedance to the transmission line impedance, which is again matched to the RF source. Tuning the load to the RF source frequency is a separate degree of (RF) freedom obtained through an independent adjustment. Both of these operations maximize the dissipation of the available RF power in the load. The impedance and frequency response are not the sole features which demand attention, especially as the wavelength approaches the physical dimensions of the load. It is well known in the radio communications arts that when the load is an antenna, the resulting radiation field is the ultimate design goal and the field distribution and polarization distribution will be severely affected by the electrical symmetry properties of the radiator. It has long been known that the radiation field symmetry properties are disturbed for the case where an unbalanced source drives a balanced load, or a balanced source drives an unbalanced load. A balanced load is one wherein there exists a plane of electrical symmetry such that this locus may be characterized by a static electrical potential, e.g., a virtual ground. A transmission line of choice for contemporary installations is the coaxial cable, which presents an electrically unbalanced symmetry with respect to ground. The NMR coil, as thus driven, is unbalanced unless additional circuit elements are present to restore balance. One effect of imbalance in the load is that in addition to radiation from the load, radiation occurs from this unbalanced transmission line which now supports asymmetrical RF currents, and the geometrical properties of the net radiation field will be distorted. In the time reversed case where the NMR probe is receptive to resonance de-excitation, from a sample within the coil, the resulting signal will be similarly degraded.

RF communications technology has long dealt with the problem through interposition of a balanced/unbalanced conversion device, in popular parlance, a "balun". At lower frequencies this took the form of a transformer circuit, center tapped for the balanced terminals and driven from the unbalanced terminals. At higher frequencies, e.g., hundreds of MHz, transformer coupling is not practical. The prior art has developed several approaches to balun devices and these are summarized by Stutzman and Thiele, "Antenna Theory and Design", pp.183–187 (John Wiley and Sons, 1998).

A balanced NMR probe is desirable for decreasing the potential differences between portions of the coil (load) and ground and especially desirable as the wavelength associated with probe operation approach the physical dimensions of the load. A balanced probe yields a symmetric field distribution whereas the unbalanced circuit distributes the RF magnetic field asymmetrically and therefore, non-uniformly over the sample volume. Moreover, an unbalanced circuit imposes the full potential difference from maximum to ground across the sample, resulting in a larger RF electric field leading to undesirable sample heating, greater likelihood of arcing to nearby surfaces, and higher voltage tolerances upon capacitors in the circuit. Balanced NMR probes are well known, but these are commonly achieved with additional, usually lumped, circuit components. Murphy-Bosch and Koretsky, J. Mag. Res., v.54, 526–532 (1983); Probe structure often includes aspects that contribute to imbalance, e.g., internal unbalanced transmission line structures. The investigation of magnetic resonance in solid samples often utilizes transmission line components to realize high RF power required for these samples. Without additional circuit elements, a multi-resonant probe may exhibit excellent tuning and matching at its several ports while remaining essentially imbalanced. With differing RF field distributions, the concurrent resonant excitations will be spatially distributed differently, and thus the interaction of the resonant spin systems will be reduced.

SUMMARY OF THE INVENTION

Among the several objects and advantages of the invention, there is provided a balanced NMR probe achieved by surrounding (laterally and at the ground plane with an open opposite end) an unbalanced probe structure including coaxial transmission lines having outer conductor(s) with a conducting surface spaced from any outer conductor(s) and extending from the ground plane of the unbalanced probe structure by an amount $\lambda/4$ where $\lambda$ is the wavelength associated with the resonant frequency of the probe. (The term $\lambda/4$ is used in an approximate sense for reasons which will be discussed below.) The tuning and matching components of the probe circuit are constrained to placement within the resonant $\lambda/4$ length of the above mentioned conducting material with the coil disposed just beyond the $\lambda/4$ extension. This surrounding conducting material, of at least S/4 extension, functions as a balun and imposes an RF symmetry on the circuit by providing (crudely speaking) virtual parallel $\lambda/4$ transmission lines to ground on either side of the coil. The surrounding conductor desirably extends further than $\lambda/4$ to provide RF shielding in the usual manner.

When the coil is multiply tuned (additionally resonant at much lower frequency), the low frequency resonance ($\lambda$ much larger than dimensions of the probe), the lower frequency RF magnetic field intensity is distributed as a half sinusoid over the coil dimensions. The symmetrization of the high frequency resonant mode aligns the high frequency RF field as a half sinusoid superposed on the low frequency distribution. Thus, experiments based upon interaction of the respective resonating spin systems are optimized.

BRIEF DESCRIPTION OF THE DRAWINGS

FIG. 3a is an equivalent circuit for FIG. 2a.

DETAILED DESCRIPTION OF THE PREFERRED EMBODIMENT

Figure 1:
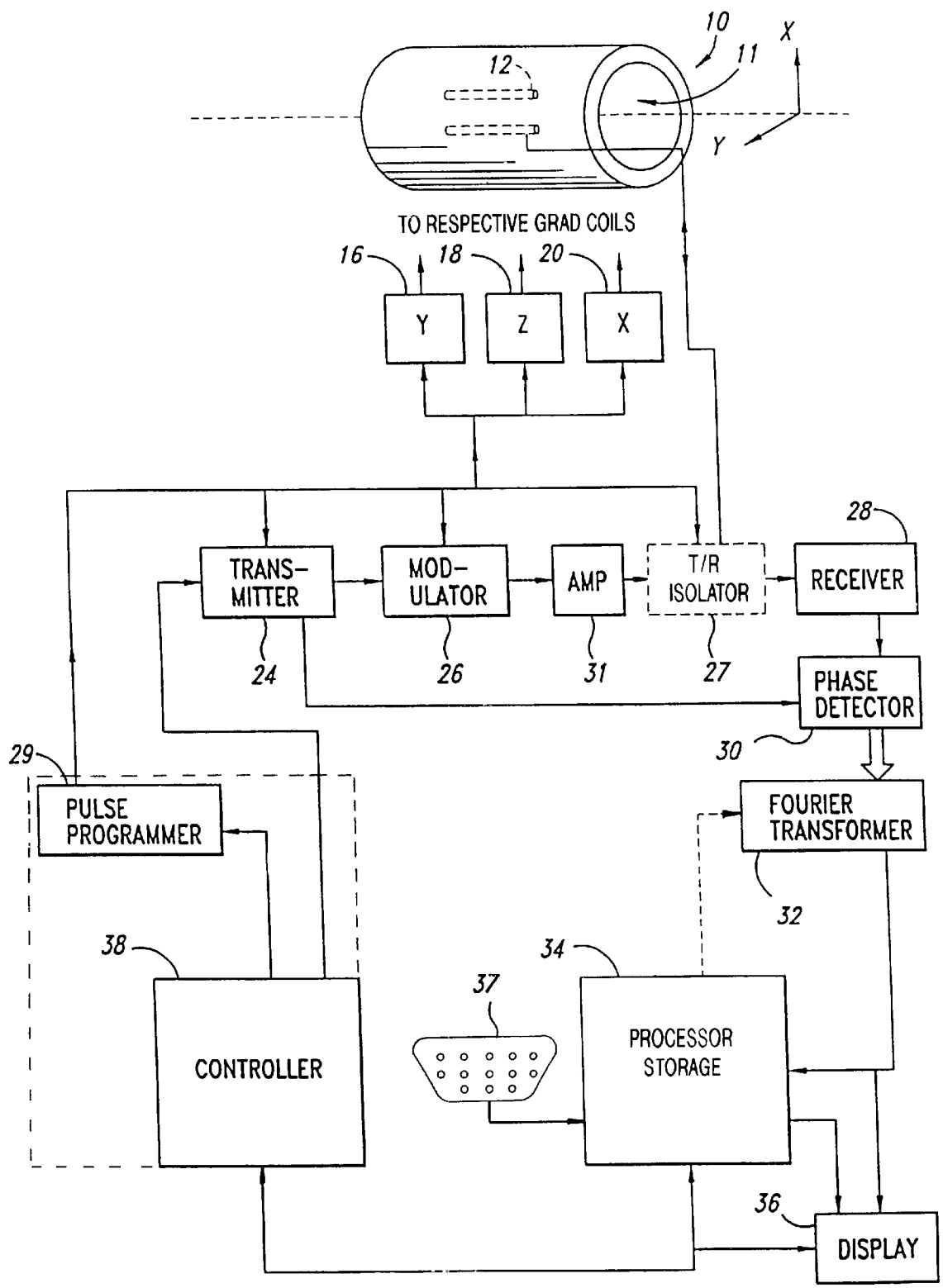
FIG. 1 depicts the system forming the context of the invention.

In FIG. 1 there is shown in block form a typical NMR apparatus. A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

As shown in FIG. 1, RF power is provided from first transmitter 24a, and is amplified by an amplifier 31 and then directed via transmit/receive (T/R) isolator 27 to the probe 12 that includes RF transmitter coil located within the bore 11. The transmitter 24 may be modulated in amplitude or frequency or phase or combinations thereof, either upon generation or by a modulator 26. Additional transmitter 24b/modulator 26b components are often employed to independently excite different gyromagnetic resonators, e.g., protons and C13. These independent excitations are conveniently supported by a multiply resonant coil as described herein. Transmit and receive functions are not concurrently active. The identical coil within probe 12 may be employed for both functions if so desired. Thus, the T/R isolator 27 is provided to separate the receiver from the transmitter. In the case of separate transmitter and receiver coils, element 27 will perform a similar isolation function to control receiver operation.

The modulator 26 is responsive to controller 38 including pulse programmer 29 to provide RF pulses of desired amplitude, duration and phase relative to the RF carrier at preselected time intervals. The pulse programmer may have hardware and/or software attributes. The pulse programmer also controls the gradient power supplies 16, 18 and 20, if such gradients are required. These gradient power supplies may impose gradient pulses or maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit of processor 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more digital processors, controls and correlates the time critical operations, such as the performance of pulse sequences. Controller 38 ordinarily incorporates an independent time base for maintaining synchrony with resonant spin systems. Overall operation of the entire apparatus within processor 34 includes input 37 from operating personnel, non-time critical calculation and output for further processing or display.

Figure 2B:
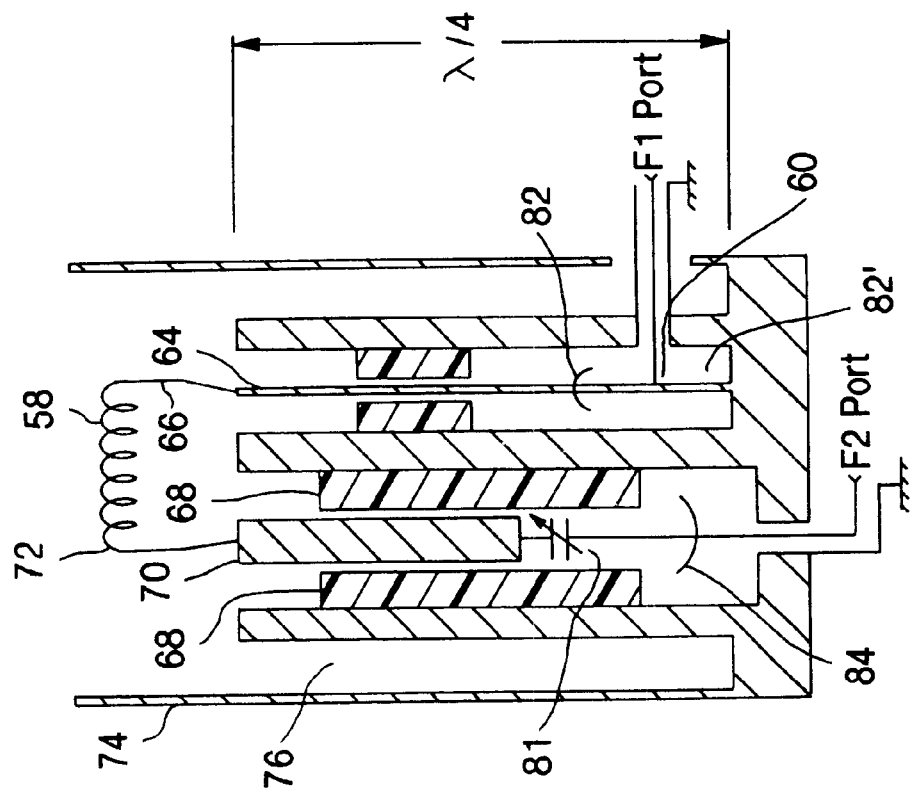
FIG. 2b shows the improved NMR probe of the invention.
Figure 2A:
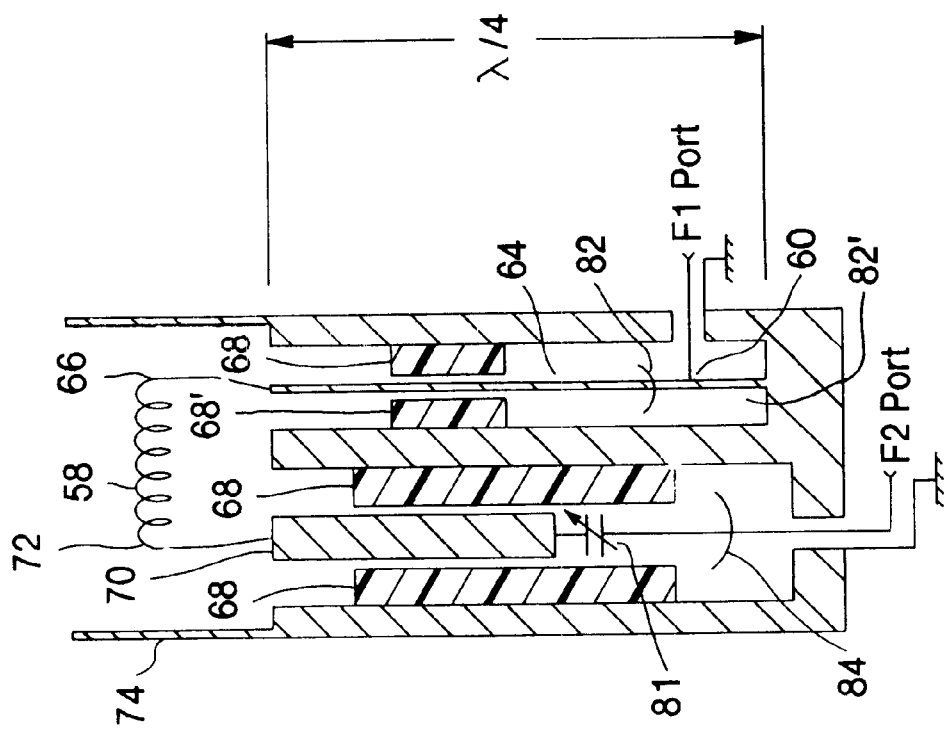
FIG. 2a is an NMR probe of prior art.

FIG. 2a is a representational illustration of a known NMR probe (here, a dual resonant circuit) that employs transmission line tuning. The corresponding equivalent circuit is shown at 3a. While nominally a balanced circuit in form, the transmission line elements 52 and 54 are quantitatively distinct to serve their respective tuning/matching functions and RF balance is perturbed. (It is known to provide trimming networks of capacitors, for example, which restore balance.) Moreover, the intrinsic nature of unbalanced transmission lines introduces imbalance to the probe as a whole. The prior art probe of FIG. 2a employs a coaxial line 82 shorted at one end and length slightly more than $\lambda/4$ (resonant frequency=600 MHz) to drive a load, here, solenoidal coil 58 disposed proximate the open aperture of the $\lambda/4$ stubs 82 and 84. In one example, the coil 58 is wound from wire approximately $0.2\lambda$ in length. A variable tap point 60 is provided for impedance matching to a 50Ω feed for RF (600 MHz) power applied at F1. In order to tune the transmission line 82, a sliding dielectric tuning slug 68' is provided. A sliding ground plane is an alternate way to accomplish this function. At the open end of transmission line 82, the center conductor 64 connects to one end 66 of the solenoid 58. In similar fashion, dielectric tuning slug 68 is provided to adjust the capacitance of transmission line 84, the center conductor 70 of which connects to the other end 72 of solenoid 58. This low impedance transmission line 84 provides sufficient shunt capacitance to resonate coil 58 at the desired lower frequency F2, matched to its low frequency source with coupling capacitor 81. A shield 74 extends axially to limit radiation, in the region of coil 58 per conventional usage. Dual resonant probes of this form have been made and sold by Varian Chemagnetics and its predecessors under the product designation "T3".

In discussions related to multi frequency probes implemented with $\lambda/4$ transmission lines, the actual transmission line is usually not exactly $\lambda/4$. At resonance such a line presents an effective open circuit to the resonant traveling wave. Thus in FIG. 3a for example, the transmission line 84 providing capacitance to ground on the undriven side of coil 58 must not present an excessive impedance to the F1 port. It is common in such circumstance to reduce (or increase) the length of the actual $\lambda/4$ line by 10%–20% to provide an adequate path to ground for the RF (high frequency) power applied to the F1 port. Lumped capacitance may be added to the affected leg of the circuit to improve the efficiency of the circuit.

Turning now to FIG. 2b, the invention is implemented in a preferred embodiment by introducing a spacing 76, of length at least $\lambda/4$, between shield 74 and the transmission line structures 82 and 84 of the prior art probe whereby the RF field in the general space 76 is perturbed to remove the outer conductors of the transmission lines 82 and 84 from ground at the high frequency resonance F1. The shield 74 thus forms an outer conductor of an effective open transmission line of length $\lambda/4$ with a load (coil 58) disposed axially beyond the aperture (at $\lambda/4$). The conducting sleeve 74 may be extended axially beyond the $\lambda/4$ point to function as an RF shield for the coil 58.

Figure 3A:
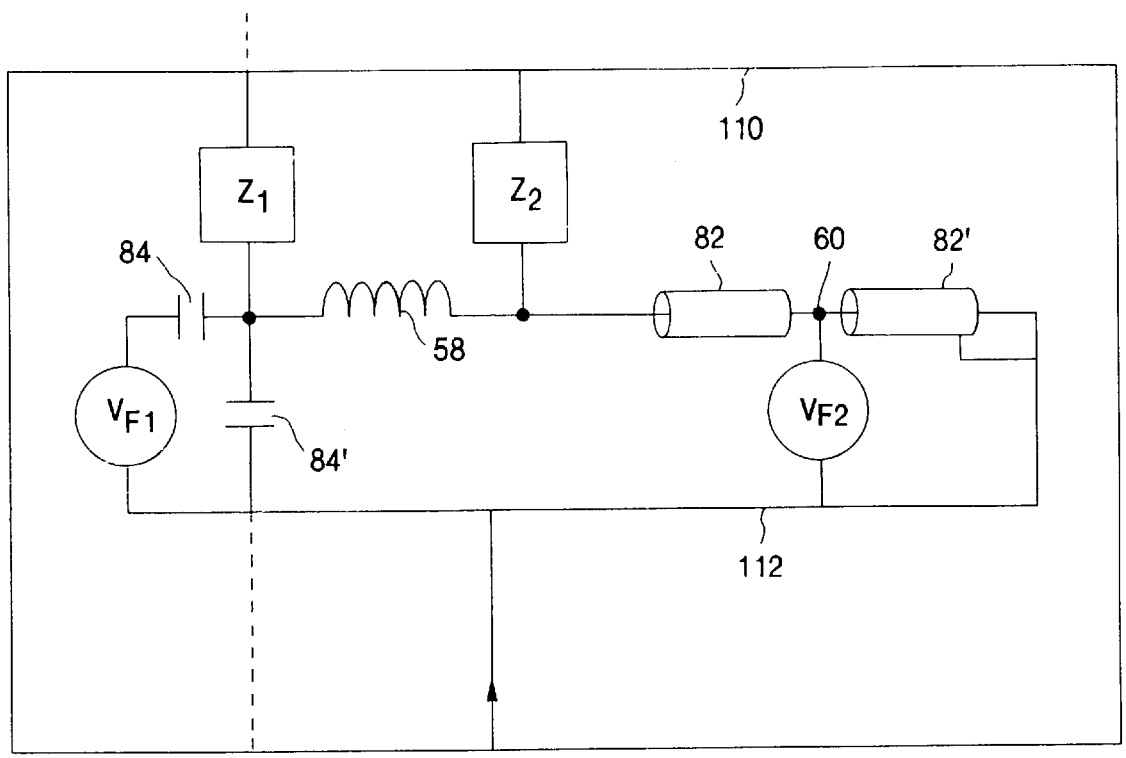
Figure 3B:
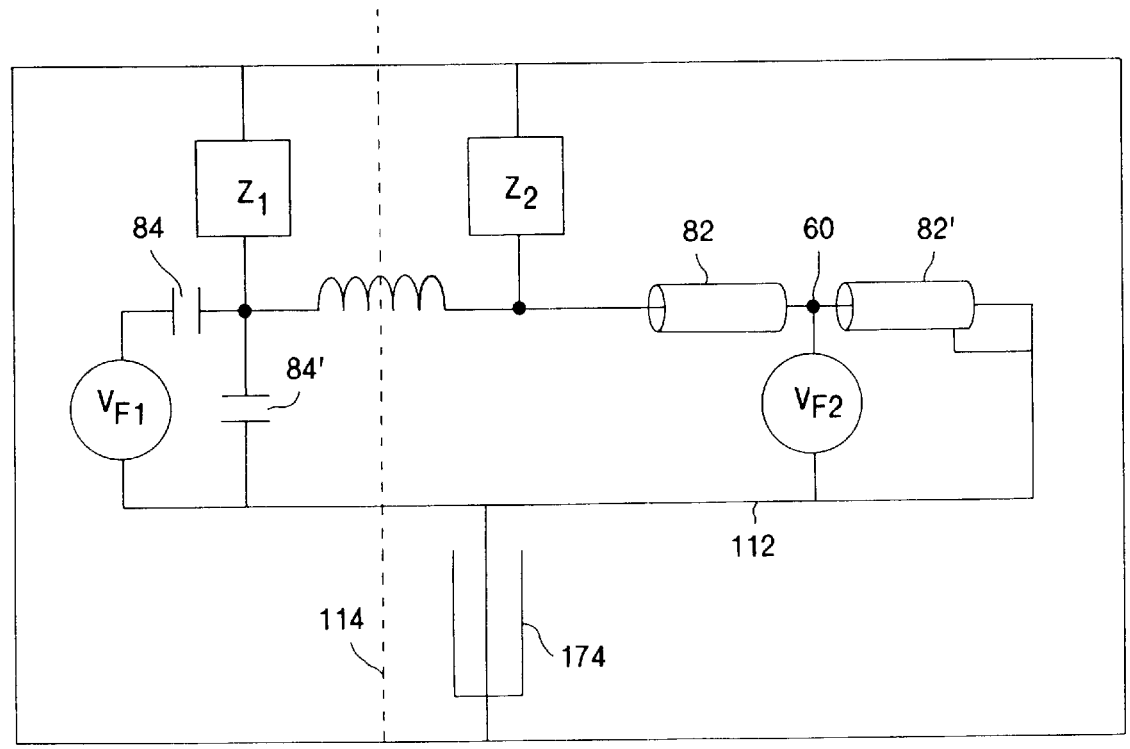
FIG. 3b is the equivalent circuit for the inventive embodiment of FIG. 2b.

FIG. 3a is a simplified equivalent circuit for the prior art probe of FIG. 2a. At the outset it is recognized that lumped component representations are mere cartoons of the complex traveling wave dynamics of these circuits: however, the main points of the discussion are advanced thereby. A tapped transmission line 82–82' provides a high frequency input at the tap point 60 for excitation of the tuned circuit comprising coil 58 through low impedance $Z_1$. (predominantly distributed capacitance) to ground. Concurrently low frequency RF is introduced through matching capacitor 81 through coil 58 to ground through $Z_2$. The impedances $Z_1$ and $Z_2$ each include all couplings to ground 110. These couplings are predominantly frequency dependant and may also include parasitic effects. The low impedance tuning capacitor 84 is such that that one may regard the proximate end of coil 58 to be at ground potential shorting $Z_1$. The circuit is inherently asymmetric. Consider now the inventive arrangement as illustrated in FIG. 3b wherein the local ground 112 is isolated from ground 110 by the $\lambda/4$ line 174 which presents a very high impedance at frequency F1. The impedance $Z_1$ is no longer shorted to ground and coil 58 is essentially flanked by impedances $Z_1$ and $Z_2$ with the result that for substantially equal total impedances to the right and to the left of coil 58, a virtual ground plane is established in the axial median plane of the coil 58 intermediate its ends. One may regard the functional effect of the $\lambda/4$ stub 174 as restoring balance to the previously unbalanced circuit of FIG. 3a.

As the wavelength of the RF excitation supported by the probe approaches the dimensions of the load, the distortion of the RF field distribution in the near field region becomes significant, as parasitic currents, depending upon frequency dependent effects, become large. The effect of the $\lambda/4$ length shield (disposed as described with respect to the probe circuit components) serves two functions: it is the outer conductor of a $\lambda/4$ transmission line stub, and in its further extension, is an effective RF shield.

The prior art NMR probe provides a graphic demonstration of the effect upon the high frequency RF field distribution for 600 and 150 MHz as the resonant wavelength approaches the dimensions of the load. The curves there shown are the normalized RF magnetic field distributions on the axis of the known NMR probe of FIG. 2A and the difference in RF magnetic field intensity at the two frequencies is shown as the field deviation. The curve labeled 600 MHz ($H^1$) is shifted substantially with respect to the 150 MHz ($C^{13}$) curve. It should be readily apparent that the deviation measures a degree of loss in efficiency where experiments depend upon the mutual excitation of both $H^1$ and $C^{13}$ such as cross polarization and the like. The displacement of these distributions is clearly disadvantageous for experiments where there is an interaction between hetronuclear spins (such as $H^1$ and $C^{13}$). Various polarization transfer experiments are easily seen to suffer from this lack of alignment of the RF field distributions for the two resonant nuclei. These field distributions are obtained by a field perturbation method well known in the art. (see Ginzton, Microwave Measurements, McGraw Hill Book Co., Inc. 1957). For an NMR measurement, the known probe of FIG. 2a achieves a signal-to-noise ratio (SNR) for hexamethylbenzene of 197 in a cross polarization magic angle spinning experiment of 4 scans and 3KHz spinning rate.

Figure 4A:
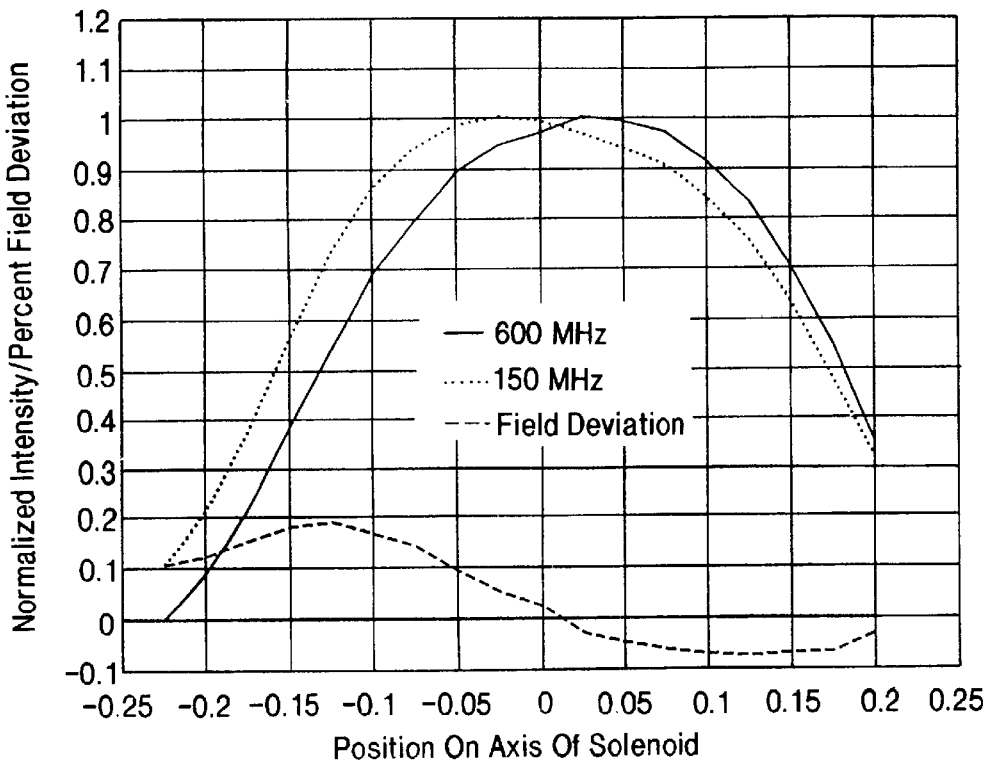
FIG. 4a compares the axial RF magnetic field distributions for a double resonant probe of prior art.
Figure 4B:
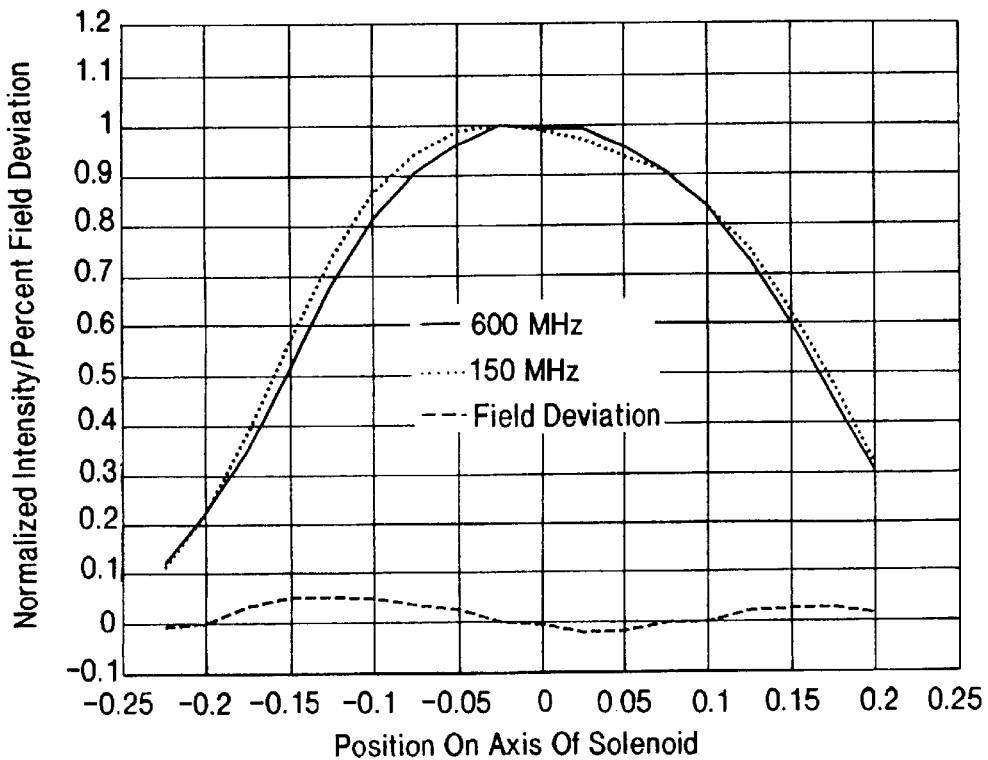
FIG. 4b is the same comparison as FIG. 4a for the present invention.

The present invention provides alignment of high frequency (600 MHz) with low frequency (150 MHz) RF current distributions as shown in FIG. 4b. At 150 MHz, the (low frequency) RF current distribution is substantially unaffected by the presence of the $\lambda/4$ line formed by shield 74 and spacing 76 from the probe circuit components. That is, the parasitic effects in this apparatus are negligible compared to those obtaining at the high frequency. This low frequency is such that the associated wavelength is large compared with dimensions of the load and the parasitic effects are negligible. The corresponding NMR measurement demonstrates a value of SNR=320 for an improvement of 62% as a direct result of the improved field overlap. The general result of this invention applies to any pair of resonant frequencies having a sufficiently large ratio wherein the shorter wavelength resonance is asymmetrically distributed along the load while the longer wavelength resonance remains distributed with substantial symmetry. That is, the parasitic effects are relatively negligible for the low frequency resonance and quite substantial for the high frequency resonance. The invention is applied in this circumstance to re-align the high frequency RF field distribution along the axis to match the low frequency RF field distribution. The range of value for such ratio is not so much a quantitative specification as it is a specification of the context in which the multi-resonant circuit operates and the sensitivity of associated apparatus.

Figure 4D:
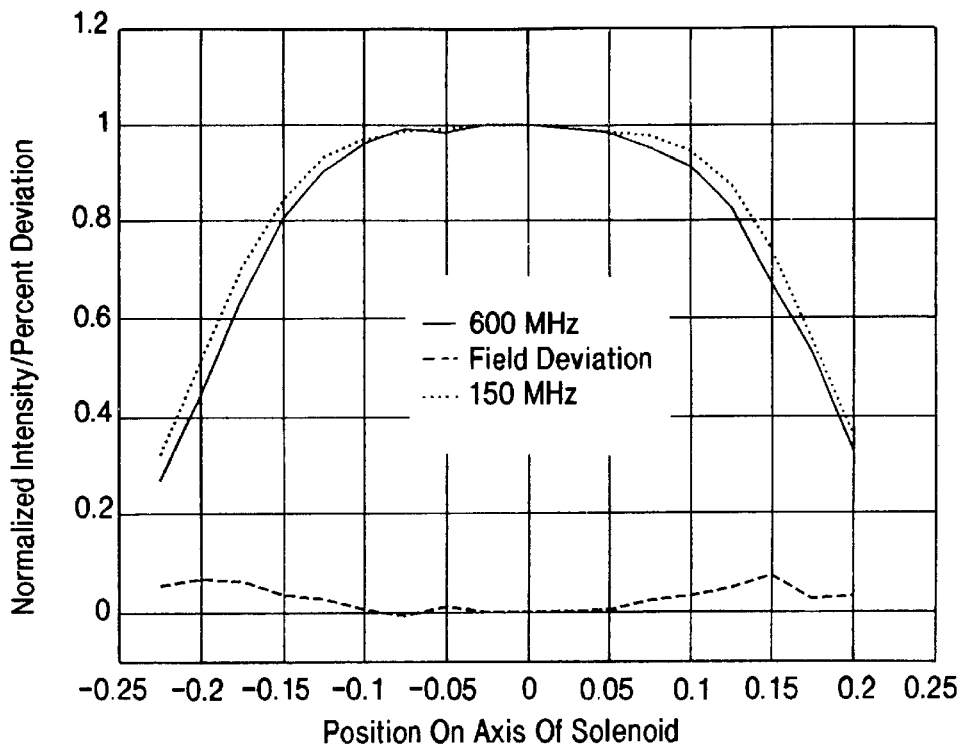
FIG. 4d is the same comparison as FIG. 4b for the present invention with a variable pitch solenoid.
Figure 4C:
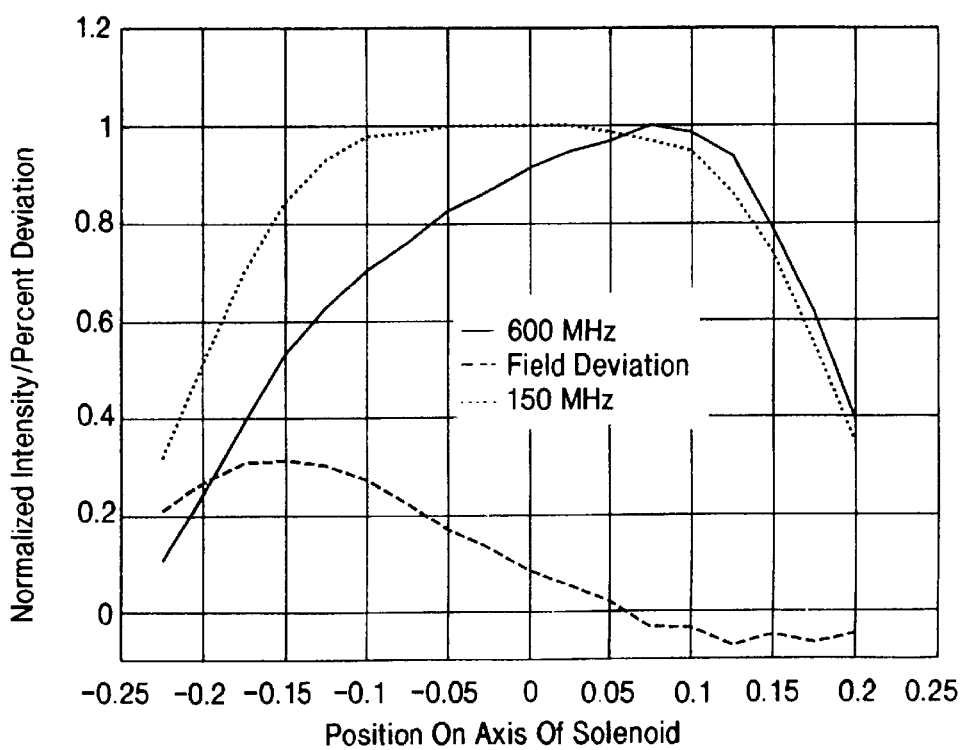
FIG. 4c is the same as FIG. 4a for a prior art probe with variable pitch solenoid.

FIG. 4C is similar to FIG. 4A with the difference that the solenoidal coil 58 (FIG. 2A) is replaced by a variable pitch solenoidal coil. Such variable pitch coils exhibit a less dense axial winding density in the region intermediate the end regions of the coil as compared with the winding density in these end regions, in order to obtain improved axial RF field homogeneity. It is apparent that the axial RF field distribution at high frequency is quite distorted whereas the same coil in the inventive structure supports a substantially symmetrized, e.g., balanced RF field distribution as shown in FIG. 4D.

Figure 5:
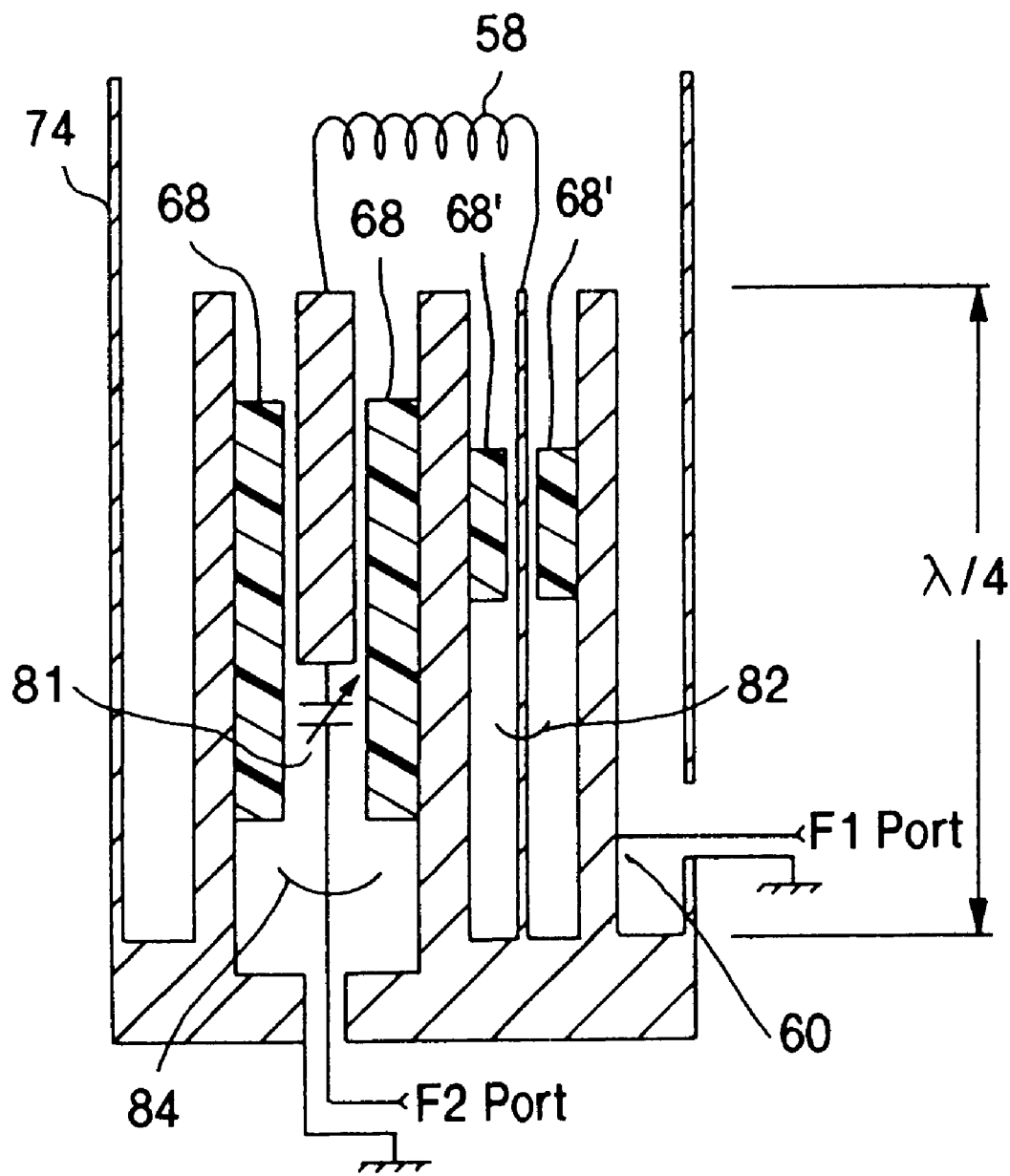
FIG. 5 is another embodiment of the invention.

Turning now to FIG. 5, an alternate embodiment is shown wherein the tap 60' is provided to drive the outer conductor 83 of transmission line 82 (instead of providing the tap to the inner conductor 64 of FIG. 2b).

In another embodiment, it is recognized that at sufficiently high frequencies of operation, it is desirable to restore balance to each of the ports of a multi-resonant probe, when the lower frequency field distribution is also substantially distorted by parasitic effects.

The obvious case of physical interest in the field of NMR occurs for $^1H$ and $^{13}C$ for which the nuclear magnetic moments, and thus the resonant frequencies, are related by a factor of 4. Thus, in this embodiment, the shield 74 may exhibit an extension of $3\lambda/4$ for the (as projected onto conductors 70 and 64, for example) for the high (proton) frequency F1 while concurrently presenting a length of $\lambda/4$ to the low ($^{13}C$) frequency, F2. In principle, this embodiment is effective for any pair of nuclear species wherein the nuclear magnetic moments are in the ratio of $2^{-2N}$.

It is apparent that the ability to superimpose the RF current distributions (and hence, the corresponding RF magnetic fields, $B_0$,) for concurrently excited nuclei, maximally fulfills the Hartman-Hahn condition for interaction of two (or more) spin systems.

Independently, the symmetrization of the RF magnetic field about a median plane of the coil, reduces the magnitude of variation of $B_1$ in a central region of the sample. This reduction is owing to the symmetrization of the z dependence of the RF magnetic field on opposite sides of the median plane.

In the particular application for NMR probes, it is especially useful that the desirable result is obtained by a single, simple structural entity with minimal disturbance of the circuit. this single structural entity, e.g., a conductive sleeve, offers both implementation of a $\lambda/4$ open transmission line and, in further axial extension, an effective RF shield.

Although this invention has been described with reference to particular embodiments and examples, other modifications and variations will occur to those skilled in the art in view of the above teachings. For example, much of the discussion has employed the example of a dual resonant probe. The invention may be usefully employed to restore electrical balance to single, triple, or other multiple resonant NMR probes. It should be understood that, within the scope of the appended claims, this invention can be practiced otherwise than as specifically described.

What is claimed is:

1. An NMR probe comprising an RF coil, said probe further comprising components for tuning and matching said coil to at least one RF power source at a first frequency, said components disposed within an axial extension of substantially $\lambda/4$ at said first frequency, an axially extending conducting shield surrounding said components and spaced apart therefrom, said shield comprising a planar ground closure at one end and said shield open at the other end and said coil disposed beyond said $\lambda/4$ extension.

2. The NMR probe of claim 1 wherein said axial conducting shield extends substantially beyond said coil.

3. The NMR probe of claim 1 wherein RF power is derived from multiple sources for resonant excitation through said RF coil while maintaining substantial RF isolation between said RF sources.

4. An NMR apparatus for investigation of compositions of matter, comprising a magnet for imposing a magnetic field of desired characteristics on said composition of matter, a high frequency RF power source for exciting first selected nuclei within said composition to resonance in said magnetic field, and a low frequency RF power source for exciting second selected nuclei within said composition to resonance in said magnetic field, an NMR probe comprising an RF coil, said probe farther comprising components for tuning and matching said coil to at least one RF power source at a first frequency, said components disposed within an axial extension of substantially $\lambda/4$ at said first frequency, an axially extending conducting shield surrounding said components and spaced apart therefrom, said shield comprising a planar ground closure at one end and said shield open at the other end and said coil disposed beyond said $\lambda/4$ extension.

5. The method of imposing axial RF field symmetry on an NMR probe characterized by a ground plane, a resonant wavelength $\lambda$ and comprising an RF coil and a non-balanced arrangement of components for tuning and matching said coil, comprising the steps of (a) confining said arrangement of components within a space substantially of extent $\lambda/4$ from said ground plane, (b) laterally surrounding said non-balanced arrangement with a conducting surface to form a conducting lateral enclosure spaced from said arrangement, (c) providing a planar ground plane closure at one extreme end of said enclosure, (d) axially extending said enclosure a distance at least $N\lambda/4$ from said ground plane, forming an open end to said enclosure thereat, N being an odd integer, (e) disposing said RF coil beyond said $\lambda/4$ extent from said ground plane.

6. The method of claim 5 further comprising increasing said axial extension of said enclosure beyond said RF coil to provide RF shielding to said coil.

* * * * *